US006709889B2

(12) United States Patent
Gore et al.

(10) Patent No.: US 6,709,889 B2
(45) Date of Patent: Mar. 23, 2004

(54) SMART CARD MODULE AND METHOD OF ASSEMBLING THE SAME

(75) Inventors: Kiron P. Gore, Libertyville, IL (US); Kevin Haas, Bartlett, IL (US)

(73) Assignee: Motorola, Inc., Schaumburg, IL (US)

( * ) Notice: Subject to any disclaimer, the term of this patent is extended or adjusted under 35 U.S.C. 154(b) by 5 days.

(21) Appl. No.: 10/270,814

(22) Filed: Oct. 15, 2002

(65) Prior Publication Data

US 2003/0102541 A1 Jun. 5, 2003

Related U.S. Application Data

(62) Division of application No. 09/564,884, filed on May 4, 2000, now Pat. No. 6,492,717
(60) Provisional application No. 60/146,925, filed on Aug. 31, 1999.

(51) Int. Cl.[7] ............................................. H01L 21/44
(52) U.S. Cl. ..................... 438/106; 438/125; 257/679
(58) Field of Search ............................. 438/106, 125; 257/679

(56) References Cited

U.S. PATENT DOCUMENTS

| 4,625,102 A | 11/1986 | Rebjock et al. |
| 5,378,857 A | 1/1995 | Swailes |
| 5,519,201 A | 5/1996 | Templeton, Jr. |
| 6,028,774 A | 2/2000 | Shin et al. |
| 6,054,774 A | 4/2000 | Ohmori et al. |
| 6,191,366 B1 | 2/2001 | Onishi et al. |
| 6,288,905 B1 * | 9/2001 | Chung .................. 361/771 |

* cited by examiner

Primary Examiner—Luan Thai
(74) Attorney, Agent, or Firm—Valerie M. Davis

(57) ABSTRACT

A module (10) for use with a smart card (50) is disclosed. The module (10) includes a substrate (14) having a first side (16) and a second side (18). The first and second sides each have deposited thereon a metallic layer (19, 21), with the substrate (14) having a thickness of about 125 microns. A die (22) is mounted adjacent the substrate first side (16), with the die (22) being coupled to the substrate first side (16) by a plurality of wire leads (24). A protective coating (26) covers the die (22), with the module having a total thickness of about 525 microns.

6 Claims, 3 Drawing Sheets

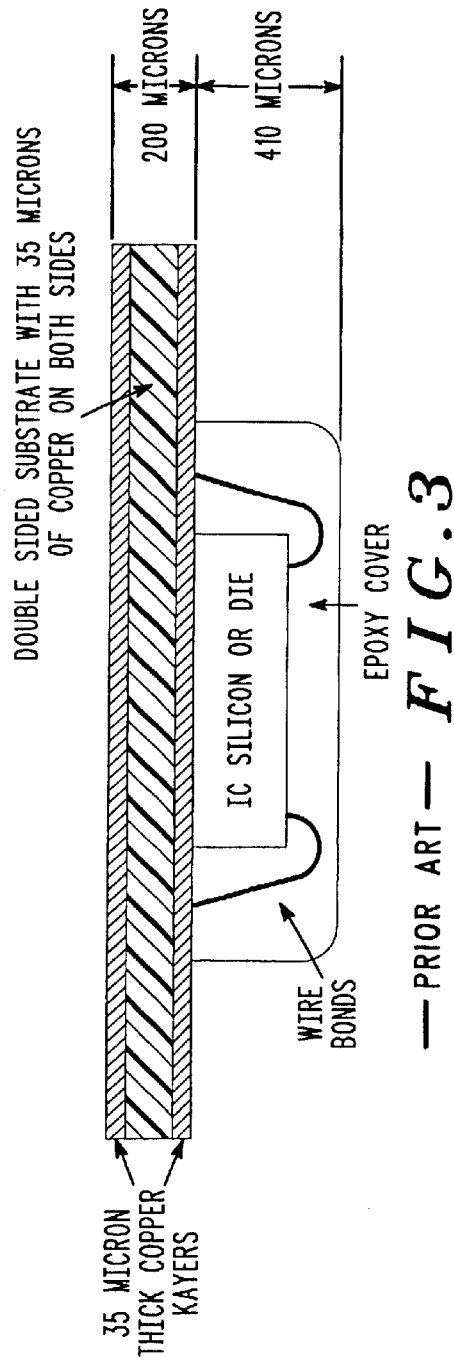
—PRIOR ART— *FIG. 3*
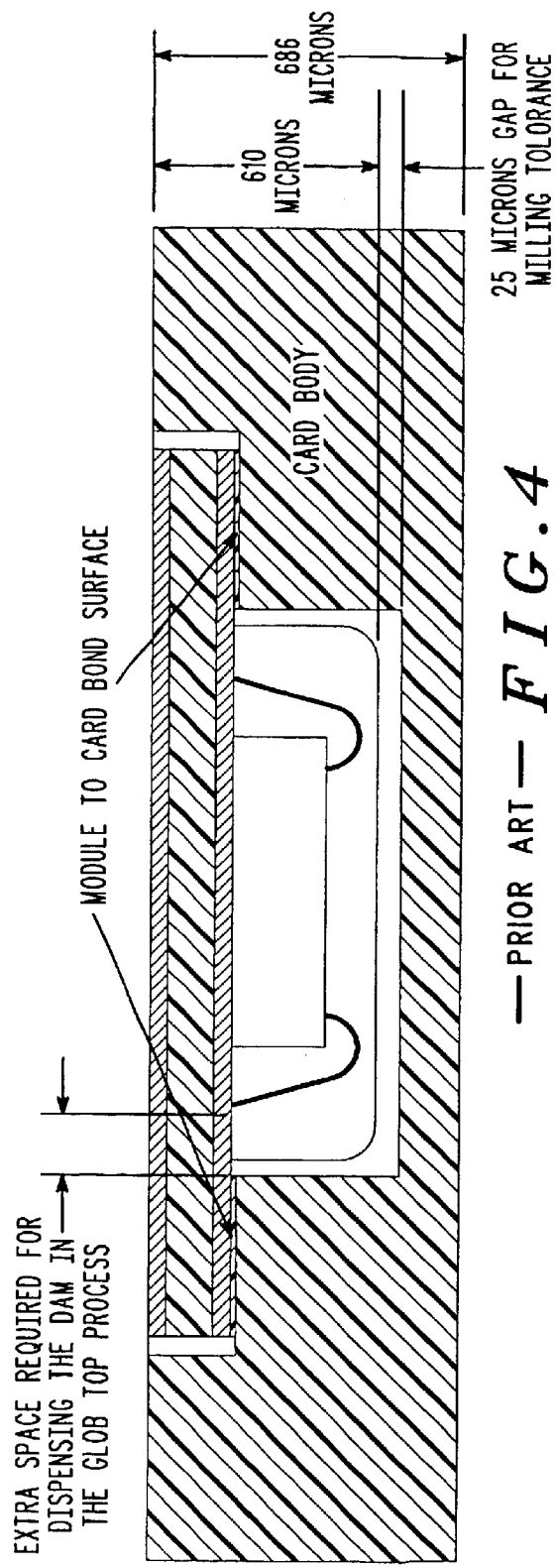
—PRIOR ART— *FIG. 4*

SMART CARD MODULE AND METHOD OF
ASSEMBLING THE SAME

RELATED APPLICATIONS

Divisional Prior appl. No. 09/564,884 filed May 4, 2000, now U.S. Pat. No. 6,482,717.

This application claims domestic priority from earlier filed U.S. Provisional Application SN 60/146,925, filed Aug. 3, 1999.

FIELD OF THE INVENTION

The present invention relates generally to smart cards, and more specifically relates to an improved dual mode smart card module, an improved dual mode smart card incorporating such a module, and a method of forming the same.

BACKGROUND OF THE INVENTION

Dual mode smart cards incorporate contacted and contactless interfaces into a single card. Dual mode smart cards typically include a module which is disposed in a recess in a card body. The module typically includes a double sided substrate having a metalized layer on each side, and an integrated circuit wafer or die coupled to the substrate, such as by wire leads. A protective coating or encapsulant covers the die. Antenna leads or pads for the contactless application are provided which are not covered by the protective coating. The protective coating is typically applied using the "glob top" process.

Existing modules, such as is shown in FIGS. 3 and 4, incorporate a 200 micron thick substrate and a 410 micron thick protective coating, giving a total module thickness of 610 microns. The total card thickness is typically specified at 762 microns ±76 microns, resulting in a card measuring 686 microns thick at the low end of the tolerance. The recess which receives the module is typically 635 microns deep, with a 25 micron tolerance for milling the recess in the card body. Thus, the bottom wall of the recess will have a thickness of 51 microns. Unfortunately, such a thin bottom wall measuring about 51 microns increases distortion during the hot melt bonding used to secure the module to the card body. Moreover, such a thin bottom wall frequently tears during milling when forming the recess in the card body.

The glob topping process requires that a dam be dispensed around the die prior to application of the protective coating. The dam occupies a significant amount of surface area on the surface of the substrate, and thus less surface area is available for bonding the module to the card body. Using the glob topping process, the available surface area is typically limited to about 83.2 square millimeters, which may not be sufficient to optimize the strength of the bond and which ultimately may lead to long term field reliability problems. Attempts have been made to employ thinner, metal rings as dams around the die in order to increase the available bonding area, but in practice such metal rings place the antenna pads too close to the metal rings, requiring much tighter tolerances which raises production costs.

Accordingly, there is a need for an improved dual mode smart card module and for an improved dual mode smart card incorporating such a module.

BRIEF DESCRIPTION OF THE DRAWINGS

FIG. 3 is a schematic cross-sectional view of a prior art dual mode module; and

FIG. 4 is a schematic cross-sectional view of the prior art dual mode module of FIG. 3 shown assembled in a card.

DETAILED DESCRIPTION OF THE PREFERRED EMBODIMENTS

The following descriptions of the preferred embodiments are not intended to limit the scope of the invention to the precise forms disclosed, but instead are intended to be illustrative of the principles of the invention so that others may follow its teachings.

Figure 1:
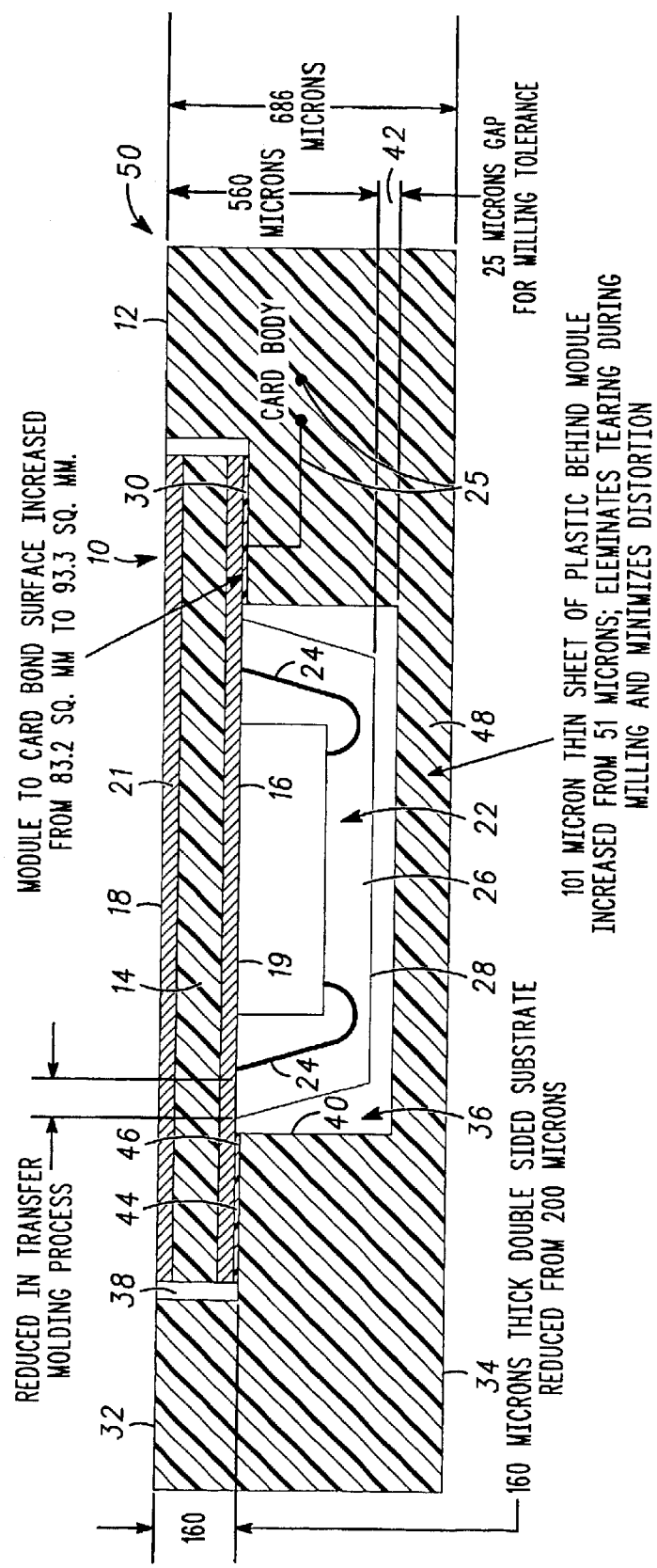
FIG. 1 is a schematic cross-sectional view of a dual mode module constructed in accordance with the teachings of a first preferred embodiment of the present invention and shown assembled in a card.

Referring now to the drawings, FIG. 1 illustrates a dual mode smart card module assembled in accordance with the teachings of a first preferred embodiment of the present invention and which is referred to by the reference numeral 10. The dual mode module 10 is adapted to enable both contacted and contactless smart card applications, which applications are known to those of skill in the art. The dual mode module 10 is shown installed in a card body or card 12. The module 10 includes a double-sided substrate 14 having a lower side 16 and an upper side 18. Each of the sides 16, 18 has deposited thereon a metallic layer 19, 21, respectively. The substrate 14 has total thickness of one hundred sixty (160) microns, inclusive of the thickness of the metallic layers 19, 21, each of which measures thirty five (35) microns. The substrate 14 having the above-described dimensions is commercially available from a wide variety of sources. An integrated circuit (IC) wafer or die 22 is coupled to the metallic layer 19 of the lower side 16, preferably by a plurality of wire bonds 24. In a preferred embodiment, the die 22 may measure about 4.8 mm by about 5.2 mm, giving a total area of about 24 mm$^2$. An antenna 25 of the type commonly employed in the art, such as a two turn wire antenna within the card body, is provided which enable the contactless application. The die 22 is preferably an EEPROM or an ASIC chip. A protective coating 26 covers the die 22. Preferably, the protective coating 26 is preferably an epoxy material, such as is commonly used in the semiconductor industry. The thickness of the protective coating 26 measures about four hundred (400) microns (i.e., the distance from the lower side 16 of the substrate 14 to a lower extent 28 of the protective coating 26). Accordingly, the module 10 will have a thickness of about 560 microns. A portion of the lower side 16 which remains uncovered by the protective coating 26 defines a bonding area 30, which preferably measures about ninety three (93) square millimeters.

The card 12 is generally rectangular in shape as would be known to those of skill in the art and is preferably manufactured of plastic such as PVC, ABS, PC, PET, or other suitable materials. The card 12 includes an upper face 32 and a lower face 34. The card 12 also includes a cavity or recess 36 which includes an upper portion 38 sized to receive therein the substrate 14 and further includes a lower portion 40 sized to receive therein the die 22 including the full thickness of the protective coating 26. A gap 42 is provided, preferably measuring twenty five (25) microns, for purposes of tolerance. The upper portion 38 of the recess 36 includes a ledge 44, such that the bonding area 30 of the module 10 and card 12 meet at an interface 46 generally defined by the ledge 44. The lower portion 40 of the recess 36 is bounded by a bottom layer or wall 48, which preferably has a thickness of about one hundred and one (101) microns. Preferably, both the upper portion 38 and the lower portion 40 of the recess 36 are formed in a known manner, such as by milling. With the module 10 secured in the card 12 as shown, the resulting dual mode smart card 50 will have a total thickness of about 686 microns.

It will be understood that the card thickness is typically specified at 762 microns, ±76 microns, giving a lower limit of 686 microns. It will also be understood that when at this lower limit, the thickness of the bottom wall 48 becomes very important for two reasons. First, the bottom wall 48, which has a minimum thickness that is thicker than the fifty one (51) micron minimum thickness found on prior art cards, is less susceptible to distortion in the presence of heat. Second, such a thicker bottom wall is less prone to tearing during the milling process used to create the recess 36.

In operation, the module 10 is assembled as follows. The die 22 is mounted adjacent the lower side 16 of the substrate 14 using conventional methods, the die 22 is glued or bonded in place, preferably using Tessa 8410 hot melt glue tape. The die 22, is operatively coupled to the conductive layer 21 on the lower side 16 of the substrate 14. The antenna leads 25 are also connected to the die 22 in a known manner.

The protective coating 26 is then formed by applying a sealed mold cavity, such as a hardened steel mold cavity (not shown) commonly employed for such purposes, around the die 22. Molten epoxy is injected under pressure into the mold cavity in a conventional manner and allowed to cure. The mold cavity (not shown) is sized so that the resulting protective coating 26 is proportioned so that the bonding area 30 defined on the lower side 16 of the substrate 14 and surrounding the die/coating arrangement measures about ninety three (93) square millimeters. The card 12 is prepared by milling the upper portion 38 and the lower portion 40 of the recess 36. The upper portion 38 must have a length and width sufficient to accept the corresponding length and width of the substrate 14, and further must be deep enough to accommodate the thickness of the substrate (i.e., at least one hundred and sixty (160) microns). Further, the ledge 44 must have an area sufficient to receive thereon the full extent of the bonding area 30 along the interface 46 between the module 10 and the card 12. After the recess 36 has been milled, the bottom wall 48 will have a thickness of about 101 microns, after allowing for a twenty five (25) micron tolerance at the gap 42.

The module 10 is secured to the card 12, preferably by using the hot melt glue bonding which is well known in the art. The module 10 and the card 12 are secured along the interface 46, such that the bonding area 30 has a total surface area of about ninety three (93) square millimeters.

Figure 2:
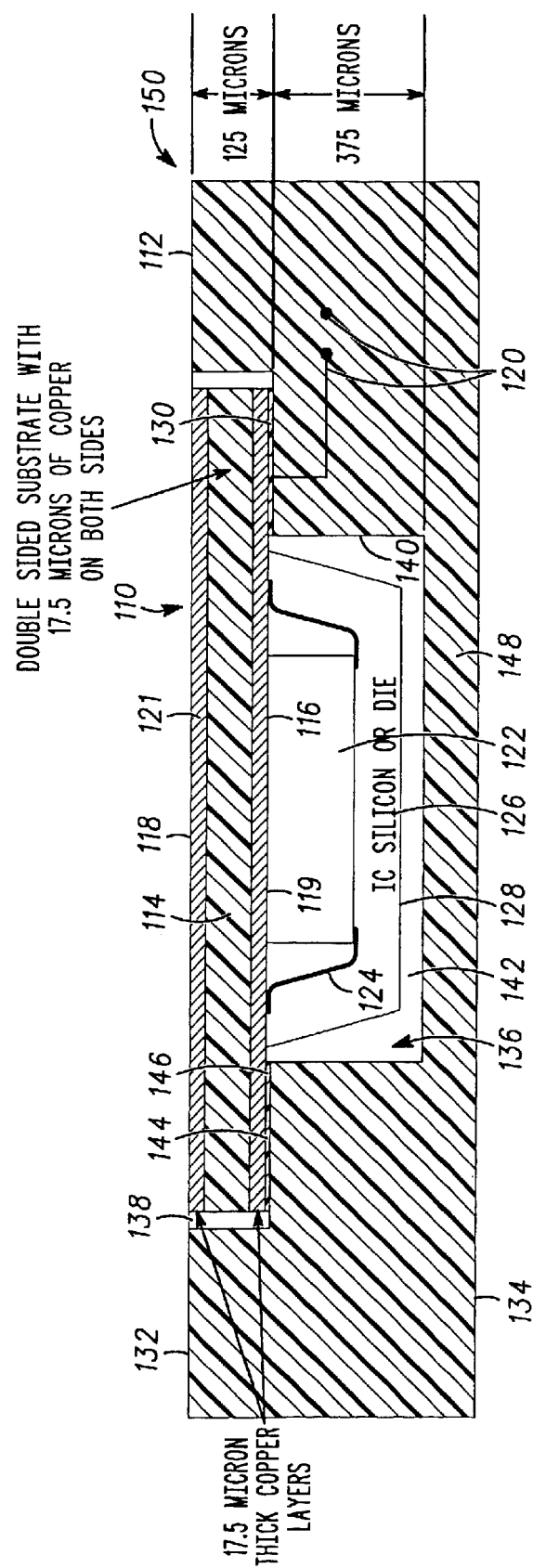
FIG. 2 is a schematic cross-sectional view of a dual mode module constructed in accordance with the teachings of a second preferred embodiment of the present invention and shown assembled in a card.

Referring now to FIG. 2 of the drawings, a dual mode smart card module assembled in accordance with the teachings of a second preferred embodiment of the present invention is referred to by the reference numeral 110 and is adapted to enable both contacted and contactless smart card applications. The dual mode module 110 is shown installed in a card 112. The module 110 includes a double-sided substrate 114 having a lower side 116 and an upper side 118. Each of the sides 116, 118 has deposited thereon a metallic layer 119, 121, respectively. The substrate 114 has total thickness of one hundred twenty five (125) microns, inclusive of the thickness of the metallic layers 119, 121, each of which measures seventeen and one half (17.5) microns. A die 22 is operatively coupled to the metallic layer 119 of the lower side 116 by a plurality of wedge to wedge wire bonds 124. An anteima 120 having a plurality of turns is provided that enables the contactless application. A protective coating 126 of an epoxy material covers the die 122. The thickness of the protective coating 126 measures about three hundred seventy five (375) microns (i.e., the distance from the lower side 116 of the substrate 114 to a lower extent 128 of the protective coating 126). Accordingly, the module 110 will have a thickness of about five hundred (500) microns. A portion of the lower side 116 which remains uncovered by the protective coating 126 defines a bonding area 130, which preferably measures about ninety three (93) square millimeters.

The card 112 includes an upper face 132 and a lower face 134. The card 112 also includes a cavity or recess 136 which includes an upper portion 138 sized to receive therein the substrate 114 and further includes a lower portion 140 sized to receive therein the die 122 including the full thickness of the protective coating 126. A gap 142 is provided, preferably measuring twenty five (25) microns, for purposes of tolerance. The upper portion 138 of the recess 136 includes a ledge 144, such that the bonding area 130 of the module 110 and card 112 meet at an interface 146 generally defined by the ledge 144. The lower portion 140 of the recess 136 is bounded by a bottom layer or wall 148, which preferably has a minimum thickness of about one hundred and sixty one (161) microns. Preferably, both the upper portion 138 and the lower portion 140 of the recess 136 are formed in a known manner, such as by milling. With the module 110 secured in the card 112 as shown such as by hot melt bonding in a known manner, the resulting dual mode smart card 150 will have a minimum total thickness of about six hundred eight six (686) microns.

Those skilled in the art will appreciate that, although the teachings of the invention have been illustrated in connection with certain embodiments, there is no intent to limit the invention to such embodiments. On the contrary, the intention of this application is to cover all modifications and embodiments fairly falling within the scope of the appended claims either literally or under the doctrine of equivalents. By way of example, one skilled in the art will appreciate that wedge bonds and wire bonds as as taught herein are readily replaceable by other types of bonding techniques known in the art and including, but not limited to ball bonds like those used in the ball grid art.

What is claimed:

1. A method of forming a smart card for use in contacted and contactless applications, the contacted application requiring a minimum card thickness of about 686 microns, the method comprising the steps of:

providing a module having a total thickness ranging between 482.5 and 560 microns, the module including a substrate having at least one conductive layer and a die operatively coupled to the conductive layer, the module further having a protective coating covering the die;

providing a card, a portion of the card defining a recess adapted to receive the module therein, the recess being bounded in part by a bottom wall having a minimum thickness ranging between 101 and 178.5 microns; and securing the module to the card along an interface.

2. The method of claim 1, including the step of transfer molding the protective coating over the die.

3. The method of claim 1, including the step of sizing the interface to have an area ranging between 93 and 150 square millimeters.

4. The method of claim 1, including the step of coupling the die to the substrate using at least one of wedge bonds, balls, and wire bonds.

5. A method of forming a dual mode smart card having a minimum thickness of about 686 microns comprising the steps of:

forming a module by:
   providing a substrate having first and second sides, each of the sides having deposited thereon a conductive layer, the substrate having thickness of about 160 microns;
   coupling a die to the conductive layer on one of the substrate sides; and
   coating the die with a protective material, the substrate, die and the coating having a total thickness of about 560 microns;
   providing a card having a recess adapted to receive the module therein, the recess being defined in part by a bottom wall having a thickness sufficient to resist deformation in the presence of heat; and
   hot melt bonding the module to the recess along an interface.

6. The method of claim 5, including the step of sizing the recess bottom wall to have a minimum thickness of about 100 microns.

* * * * *